(12) United States Patent
Sarais et al.

(10) Patent No.: US 10,038,404 B1
(45) Date of Patent: Jul. 31, 2018

(54) ADAPTIVE BIASING CONTROL FOR RADIO FREQUENCY POWER AMPLIFIERS

(71) Applicant: Infineon Technologies AG, Neubiberg (DE)

(72) Inventors: Pantelis Sarais, Villach (AT); David Seebacher, Villach (AT); Peter Singerl, Villach (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/630,242

(22) Filed: Jun. 22, 2017

(51) Int. Cl.
*H03F 1/14* (2006.01)
*H03F 1/02* (2006.01)
*H03F 1/30* (2006.01)
*H03F 3/193* (2006.01)
*H03F 3/21* (2006.01)

(52) U.S. Cl.
CPC ........... *H03F 1/0205* (2013.01); *H03F 1/301* (2013.01); *H03F 3/193* (2013.01); *H03F 3/21* (2013.01); *H03F 2200/451* (2013.01); *H03F 2200/462* (2013.01); *H03F 2200/468* (2013.01)

(58) Field of Classification Search
CPC .................................... H03F 1/14; H03F 1/30
USPC .................................................. 330/290, 289
See application file for complete search history.

(56) References Cited

U.S. PATENT DOCUMENTS

| 7,224,230 B2 * | 5/2007 | Apel ..................... H03F 1/301 330/285 |
| 9,853,608 B2 * | 12/2017 | Retz ......................... H03F 1/30 |
| 2003/0137355 A1 * | 7/2003 | Lin ......................... H03F 1/301 330/290 |

OTHER PUBLICATIONS

Bellantoni, John, "Bias Techniques for GaN and pHEMT Depletion Mode Devices", TriQuint, www.triquint.com, Eng. Rev 3, Jul. 24, 2014.
Cripps, Steve C., "RF Power Amplifiers for Wireless Communications", Second edition, Artech House, Inc., 2006, pp. 337-357.
Dorf, Richard C. et al., "Modern Control Systems", Twelfth Edition, Prentice Hall, 2011, pp. 480-492, 1008-1009.
Rosu, Iulian, "Bias Circuits for RF Devices", YO3DAC-VA3IUL, http://www.qsl.net/va3iul.

* cited by examiner

*Primary Examiner* — Henry Choe
(74) *Attorney, Agent, or Firm* — Murphy, Bilak & Homiller, PLLC

(57) ABSTRACT

Techniques are provided for adapting a bias provided to a radio frequency (RF) power amplifier (PA), so as to achieve linear operation over a wide range of conditions. The techniques use open-loop temperature compensation based upon a sensed current during periods when the RF PA is active and inactive. A closed-loop control technique is enabled when the RF PA is inactive. The combined control techniques compensate for temperature variation as well as long-term drift of the semiconductor properties of the devices within the RF PA.

19 Claims, 8 Drawing Sheets

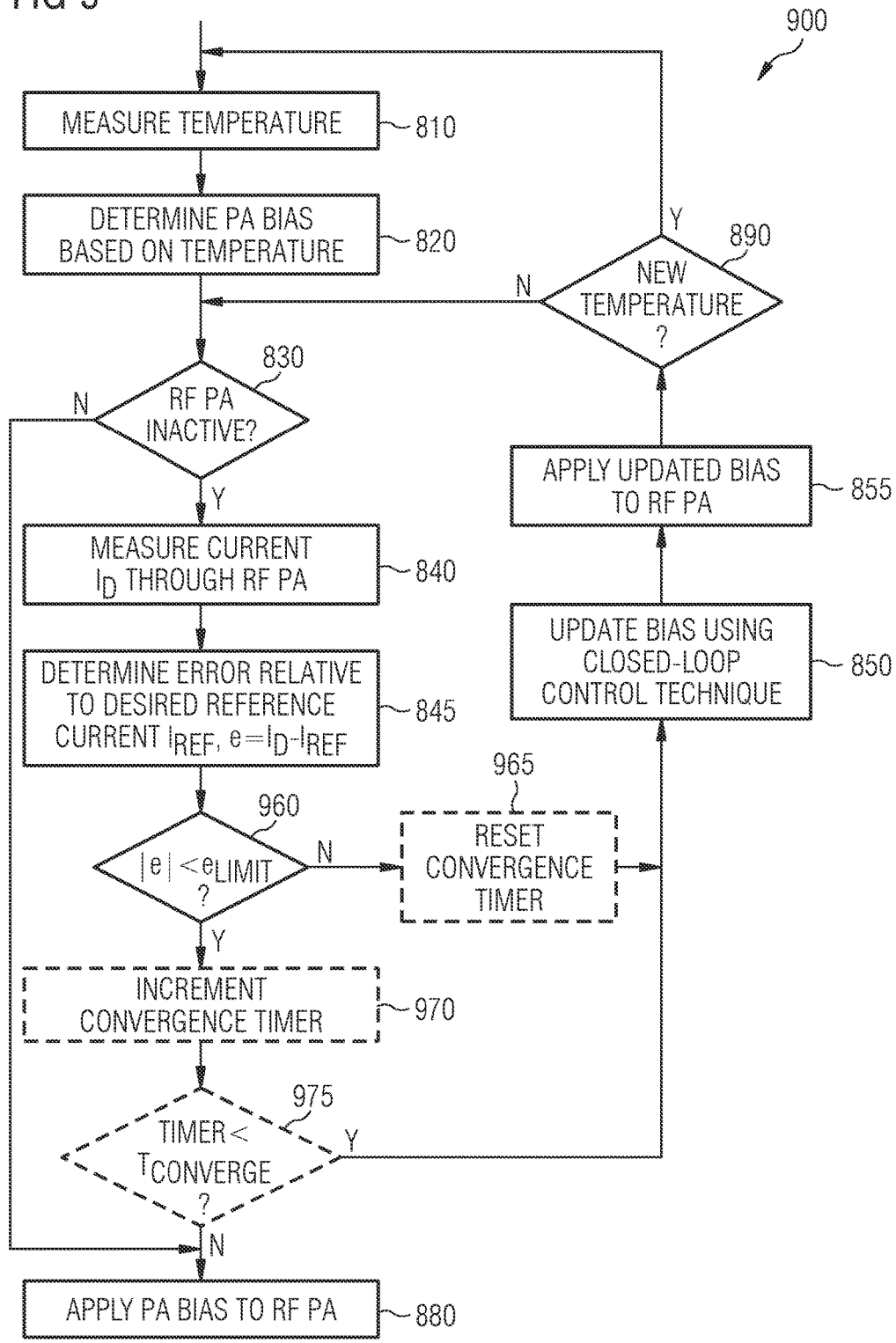

US 10,038,404 B1

ADAPTIVE BIASING CONTROL FOR RADIO FREQUENCY POWER AMPLIFIERS

TECHNICAL FIELD

The present application relates to Radio Frequency (RF) power amplifiers and, in particular, relates to techniques for biasing such power amplifiers.

BACKGROUND

Many modern wireless devices rely on radio communication, which includes the reception and transmission of Radio Frequency (RF) signals. The transmission of such RF signals typically requires the use of an RF power amplifier (PA), and RF PAs are often included within wireless devices. Such devices include terminal devices and radio base stations within wireless mobile telecommunications systems, e.g., systems based upon standards from the $3^{rd}$ Generation Partnership Project (3GPP), and which are commonly known as 3G, 4G, and 5G systems. The upcoming 5G system relies heavily on multiple-input multiple-output (MIMO) antenna technology, which uses multiple antennas and RF chains on both the transmit and receive side of a communication link. The multiple RF transmit chains used within a MIMO wireless device, e.g., a base station within a 5G system, requires an increased number of RF PAs relative to prior (non-MIMO) systems.

RF PAs require very good linearity so as to maximize the data throughput in a radio transmission. RF PAs are typically comprised of one or more power transistors, which must be operated within a particular region (e.g., their linear region) to provide such good linearity. This, in turn, requires that the transistor(s) within an RF PA be appropriately biased. For example, a field-effect transistor (FET) within an RF PA may have a constant bias voltage applied to its gate (control terminal) so that the default operation of the FET, with no RF input signal, is at a midpoint of its linear operating region. This type of biasing is typical for a class-A amplifier and leads to an amplified output that linearly follows a (small-signal) RF signal input to the amplifier for the largest possible range of the input RF signal. Other amplifier types, including, e.g., Doherty PAs, may not use a bias that places a FET at a mid-point of the FET's linear region, but nonetheless require an appropriate and consistent bias. The fundamental objective in the generation of an RF PA bias is to maintain the quiescent current through any RF power transistor(s) of the RF PA at a desired level that assures the RF PA operates within a desired class of operation. Given that various system parameters (e.g., temperature, long-term drift of the transistor conductivity relative to its control voltage) change during operation or during the lifetime of an RF PA, a fixed bias may be inadequate to achieve the linearity required by an RF PA.

Techniques for determining an optimal RF PA bias across a range of conditions are required. These techniques should use minimal resources, such that they may be feasibly applied to a large number of RF PAs, as may be included within a wireless transmitter of a MIMO system.

SUMMARY

According to an embodiment of a method, a Radio Frequency (RF) Power Amplifier (PA) is adaptively biased using a combination of control techniques. A temperature of the RF PA is measured and used to determine a preliminary PA bias. A closed-loop control technique is used to update the PA bias when the RF PA is in an inactive mode, wherein no RF input is provided to the RF PA. During such an inactive mode, a quiescent current through the RF PA is measured and compared against a reference (desired) current to generate an error current. The error current is used by a closed-loop controller, such as a proportional-integral-derivative (PID) controller, which generates a bias correction. The bias correction is added to the preliminary PA bias to create an updated PA bias, which is applied to a control terminal of the RF PA.

According to an embodiment of a bias controller for an RF PA, the bias controller includes a temperature compensation circuit and a closed-loop controller. The temperature compensation circuit is configured to measure a temperature of the RF PA and determine a PA bias based upon the measured temperature. The closed-loop controller is configured to update the PA bias during periods when the RF PA is inactive. During such periods, no RF input is provided to the RF PA and a quiescent current flows through the RF PA. While in the inactive mode, the closed-loop controller measures the quiescent current and compares it against a reference (desired) current to generate an error current. A correction bias term is generated based upon the error current, and is used to update the PA bias. The updated PA bias is then applied to a control terminal of the RF PA.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

FIG. 9 illustrates an alternative method for biasing an RF PA.

DETAILED DESCRIPTION

Figure 1:
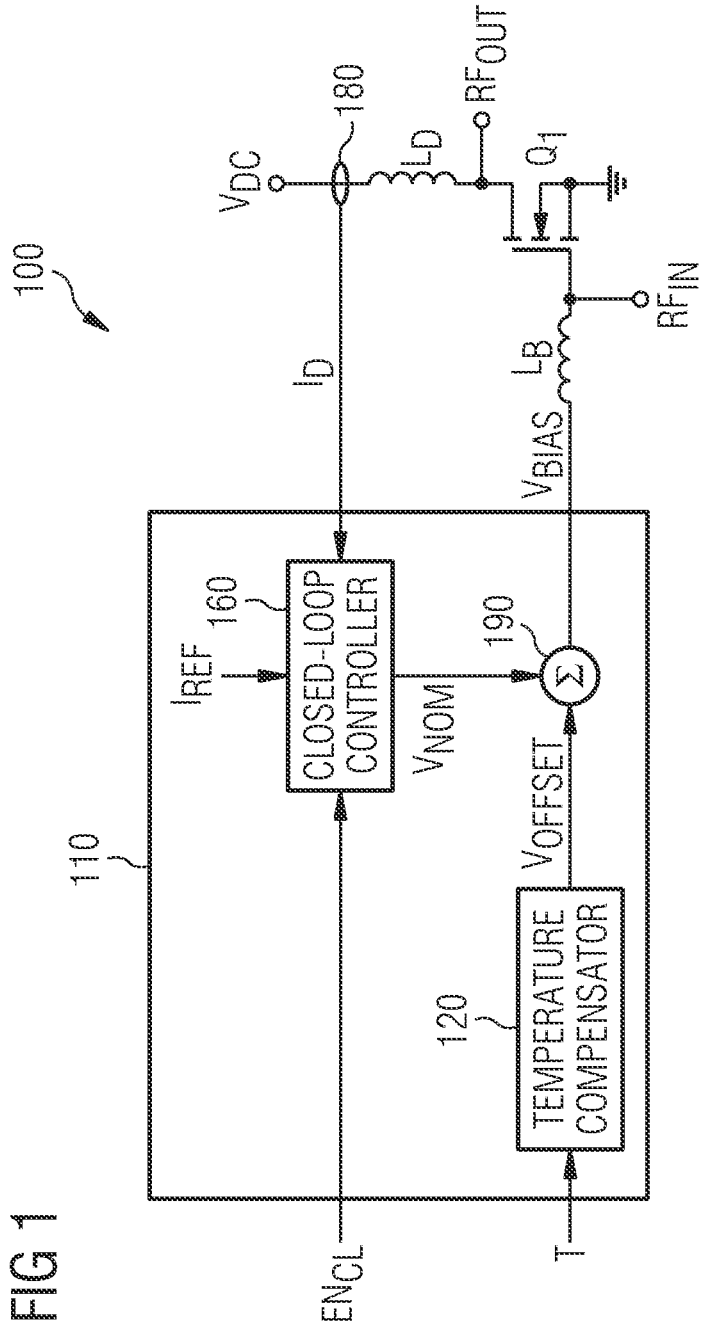
FIG. 1 illustrates an RF PA circuit that includes an adaptive bias controller.

Maintaining linear operation (or some other operation within a desired amplifier class) of an RF PA across different conditions typically requires adaptation of the bias that is applied to the RF PA. Techniques for such adaptation fall into two general categories: open-loop control and closed-loop control. An open-loop bias controller uses an input, e.g., temperature, to set the bias for an RF PA. For example, a look-up table or a polynomial function may be used to map a measured temperature of the RF PA to an appropriate bias. This mapping is generated such that the bias applied to the RF PA produces a desired quiescent current through the RF PA over a useful range of temperature. In contrast to this, a closed-loop bias controller measures the quiescent current and uses a feedback loop to adapt the RF PA bias until a desired quiescent current is achieved. Each of these control techniques has associated disadvantages under some circumstances.

Temperature compensation of the RF PA bias using an open-loop bias controller typically requires a calibration step to generate the temperature-to-bias mapping, and does not account for other (non-temperature) conditions that may cause the RF PA quiescent current to deviate from its desired level. The calibration (characterization) step involves measuring the quiescent current across an expected range of temperature so as to generate the mapping, e.g., a look-up table or closed-form function. The characterization may be performed for a single RF PA and the resultant mapping applied to a larger group of RF PAs. Alternatively, the characterization may be performed for a few representative RF PAs in order to generate a representative mapping, which is subsequently applied to a larger group of RF PAs. In yet another option, each RF PA is individually characterized, e.g., during a calibration phase of the RF PA manufacturing. The individual characterization typically provides the most accurate mapping, but the manufacturing cost associated with the production time for performing the calibration may be unfeasible and/or unnecessary for some applications. Once the mapping is generated, such an open-loop bias controller only compensates for quiescent current variations due to temperature. Other causes of variation, e.g., the long-term aging of transistor(s) within an RF PA, are not mitigated by such temperature compensation and, generally, cannot be feasibly compensated with other open-loop bias control techniques.

Closed-loop bias controllers address some of the problems associated with the open-loop temperature compensation described above. A typical closed-loop controller measures the quiescent current through an RF PA, compares it against some desired quiescent current to generate an error signal, and uses this error signal to adapt the RF PA bias. These steps are repeated until the error signal is acceptably small, which means that the measured quiescent current is approximately the same as the desired quiescent current. Because the adaptation uses the quiescent current of the RF PA, such closed-loop controllers can only adapt the RF PA bias during periods when the RF PA is inactive, i.e., when no RF input is provided to the RF PA. While such closed-loop controllers can ostensibly provide appropriate bias adaptation for almost any varying condition of an RF PA, including temperature variation and long-term aging, the requirement that closed-loop control be performed when the RF PA is inactive places significant practical constraints on the use of closed-loop control. For example, an RF PA may be active (enabled) for long periods of time during which the RF PA temperature varies considerably. A closed-loop bias controller would not be capable of adapting to the temperature variation (or other conditions) during such active periods, thereby leading to RF PA biasing that is not ideal and that may not produce the linearity required of the RF PA.

The adaptive control techniques described herein provide an RF PA bias for a variety of conditions and address many of the problems described above. Described below is an adaptive bias controller that combines elements of open-loop and closed-loop controllers so as to leverage the advantages of both. Such an adaptive bias controller can provide a near-optimal bias that compensates both for short-term condition variation (e.g., temperature) and long-term condition variation (e.g., device aging). Embodiments of adaptive bias controllers, as might be used to generate biases for individual RF PAs, are described for two exemplary RF PA topologies. These embodiments of individual adaptive bias controllers are followed by descriptions of sub-embodiments that provide detailed techniques for temperature compensation of the RF PA bias. The described techniques reduce the required calibration time and expense associated with other temperature-compensation techniques. Further sub-embodiments provide details regarding closed-loop control techniques that may be used in an adaptive bias controller. Other embodiments extend the adaptive bias controller to accommodate arrays of RF PAs, as might be required in MIMO transmitters. Further embodiments directed to methods for adaptively biasing an RF PA are also described.

Adaptive Bias Controller

FIG. 1 illustrates an embodiment of an RF PA circuit 100 including an adaptive bias controller 110. The RF PA circuit 100 also includes a transistor $Q_1$, a biasing inductor $L_B$, and a drain inductor $L_D$, and is powered from a voltage source $V_{DC}$. An RF input signal is provided to a terminal $RF_{IN}$ and an amplified RF signal is provided at a terminal $RF_{OUT}$. The adaptive bias controller 110 generates a bias voltage $V_{BIAS}$, which is provided to a gate terminal of the transistor $Q_1$ via the biasing inductor $L_B$. The bias voltage $V_{BIAS}$ is generated such that the RF PA circuit 100 operates linearly over a range of conditions. For example, the RF output signal $RF_{OUT}$ may linearly follow the input voltage $RF_{IN}$ provided at the gate terminal of the transistor $Q_1$.

The adaptive bias controller 110 includes both a temperature compensator 120 and a closed-loop controller 160. The closed-loop controller 160 operates only when the RF PA circuit 100 is inactive, e.g., when no signal is provided at the RF input $RF_{IN}$. More particularly, operation of the closed-loop controller may be initiated responsive to detecting that the RF PA circuit 100 is inactive. Such detection may be provided by receiving an enable signal, such as the illustrated $EN_{CL}$ signal, that indicates to the adaptive bias controller 110 that no RF input is active and that the closed-loop controller 160 should update its output nominal gate voltage $V_{NOM}$. (This enable signal $EN_{CL}$ may be the inverse of an enable signal used for the entire RF PA or an RF transmitter including the RF PA.) With the RF PA circuit inactive (no $RF_{IN}$ signal), a quiescent current flows from the power source $V_{DC}$ through the inductor $L_D$ and the transistor $Q_1$. A current sensor 180 senses this quiescent current flow and provides a sensed current $I_D$ to the closed-loop controller 160. A reference current $I_{REF}$ is stored within or provided to the closed-loop controller 160, and represents a desired target value for the quiescent current. (The current $I_{REF}$ is typically stored in a memory of the adaptive bias controller 110.) The closed-loop controller 160 adjusts the nominal gate voltage $V_{NOM}$ until the sensed current $I_D$ is nearly the same as the reference quiescent current $I_{REF}$. In a typical example, such adjustments are performed using a proportional-integral-derivative (PID) controller. (A digital implementation of such a PID controller is described below in conjunction with FIG. 6.) In some applications, other closed-loop control techniques may be preferred, such as proportional-integral (PI) control or proportional control. The nominal gate voltage $V_{NOM}$ is latched and the closed-loop controller 160 does not adjust this value during periods when the RF PA circuitry 100 is active, i.e., when an RF signal is applied to the input terminal $RF_{IN}$ and the enable signal $EN_{CL}$ is not active.

In contrast to the closed-loop controller 160, the temperature compensator 120 operates whether the RF PA is active or inactive. A temperature T of the RF PA circuitry 100 is provided to the temperature compensator 120. This temperature T is provided by a temperature sensor which may preferably be physically located near the transistor $Q_1$, so that the sensed temperature T corresponds closely to the temperature of the transistor $Q_1$. (The temperature sensor is typically comprised of a thermistor coupled to a voltage source and a digital-to-analog converter (DAC). For ease of illustration and because such temperature sensors are well-known in the art, the temperature sensor is not shown in FIG. 1.) The temperature compensator 120 maps the temperature T to a gate offset voltage $V_{OFFSET}$. This mapping may be performed using a table look-up, linear interpolation, higher-order interpolation, or a combination thereof. Techniques using a look-up table and a piecewise-linear approximation of the temperature-to-voltage mapping are explained in detail below in conjunction with the sub-embodiment of FIG. 5.

The nominal gate voltage $V_{NOM}$ and the temperature-compensated offset voltage $V_{OFFSET}$ are combined using an adder 190. The resultant gate bias voltage $V_{BIAS}$ is provided, via the coupling inductor $L_B$, to the gate terminal of the transistor $Q_1$.

The transistor $Q_1$ within the RF PA circuit 100 is illustrated as a laterally-diffused metal-oxide semiconductor (LDMOS) field-effect transistor, but other transistor types may be used. In addition to LDMOS, high-electron mobility transistors (HEMTs), e.g., based upon gallium nitride (GaN), are commonly used for RF PAs. Yet other transistor types may be preferred in some applications, e.g., other types of MOSFETs, junction field-effect transistors (JFETs), bipolar junction transistors (BJTs), or insulated gate bipolar transistors (IGBTs). The operation of the adaptive bias controller 110 is largely the same regardless of the type of transistor used within the RF PA circuit 100, but it is noteworthy that some transistor types, e.g., BJTs, require a biasing current rather than a biasing voltage.

The adaptive bias controller 110 may be used with RF PA topologies other than the one-transistor topology illustrated in the RF PA circuit 100, which represents a typical class-A amplifier. Other topologies may include transistors cascaded with each other, e.g., in a push-pull orientation as is typical for class-AB amplifier topologies. For cascaded or other multi-transistor RF PA topologies, a bias is generated for each of the transistors using one or more adaptive bias controllers as described above.

Figure 2:
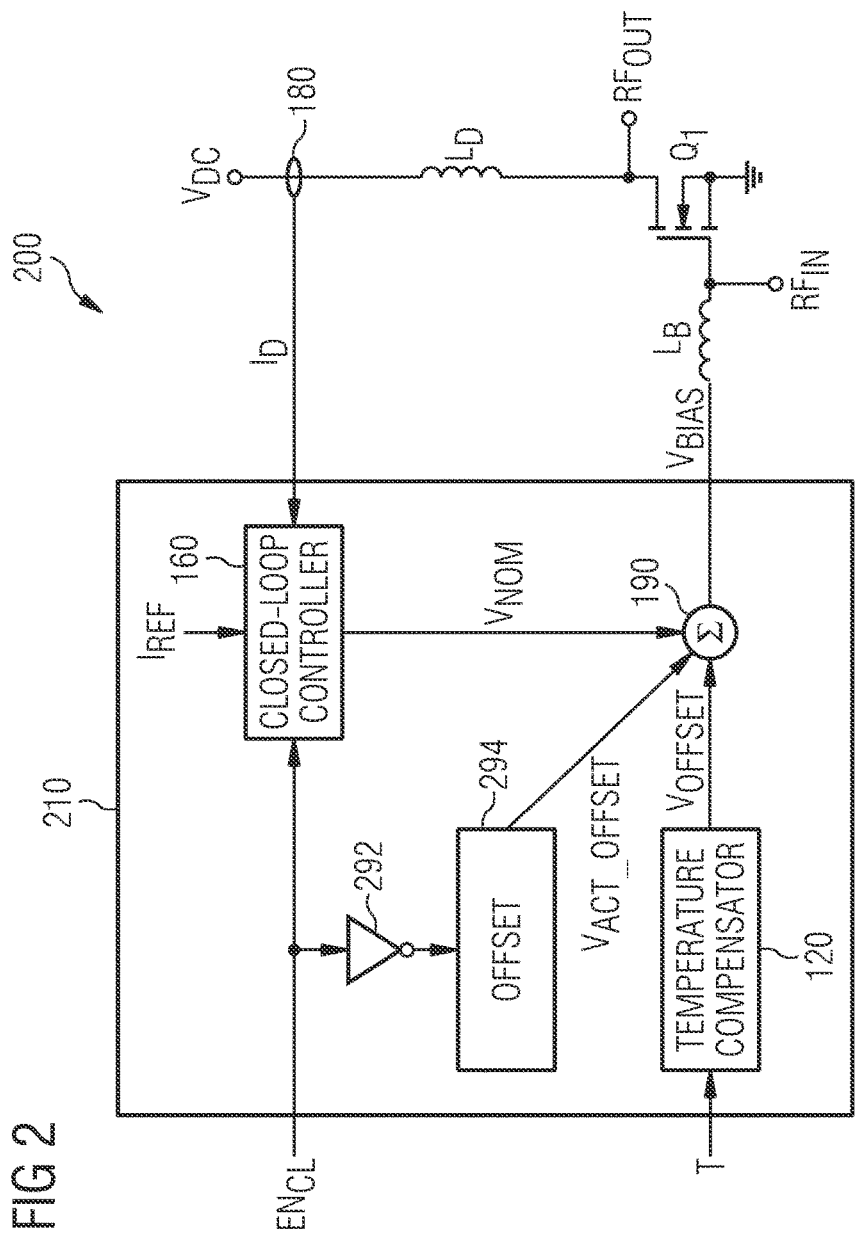
FIG. 2 illustrates an alternative RF PA circuit including an alternative adaptive bias controller, as may be used to support a Doherty amplifier configuration.

FIG. 2 illustrates another RF PA circuit 200, as might be used when implementing, e.g., a class-C Doherty peaking RF PA. The RF PA circuit 200 differs from the RF PA circuit 100 of FIG. 1 in that an active-mode offset $V_{ACT\_OFFSET}$ is included in the bias voltage $V_{BIAS}$ when the RF PA circuit 200 is active. An inverter 292 and a stored offset value 294 are used for providing the active mode offset $V_{ACT\_OFFSET}$ to the adder 190. The RF PA circuit 200 of FIG. 2 allows the bias point of the transistor $Q_1$ to be set, during an active mode of the RF PA, to some offset relative to the gate threshold voltage of the transistor $Q_1$. In other words, the adaptive bias controller 210 uses the closed-loop controller 160 and the temperature compensator 120 to determine a desired bias voltage corresponding to a gate threshold voltage of the transistor $Q_1$. When the RF PA is active ($EN_{CL}$ is disabled), a fixed offset $V_{ACT\_OFFSET}$ is added to this bias voltage to generate an updated bias voltage to be applied to the gate of transistor $Q_1$. Rather than operating the transistor $Q_1$ at a mid-point of its linear region, e.g., near its gate threshold voltage, such techniques may skew the transistor, in a controlled way, to operate in some other region. An RF tuning circuit, e.g., coupled to the RF output $RF_{OUT}$, may be used in conjunction with this skewing to achieve a desired RF output response of the RF PA.

The adaptive bias controllers 110, 210 and their constituent parts may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The adaptive bias controllers 110, 210 may also include memory, e.g., non-volatile memory such as flash, that includes instructions or data for use by the processor circuitry, and one or more timers. The adaptive bias controllers 110, 210 input sensor signals such as the temperature T and the drain current $I_D$.

Temperature Compensator

Figure 3:
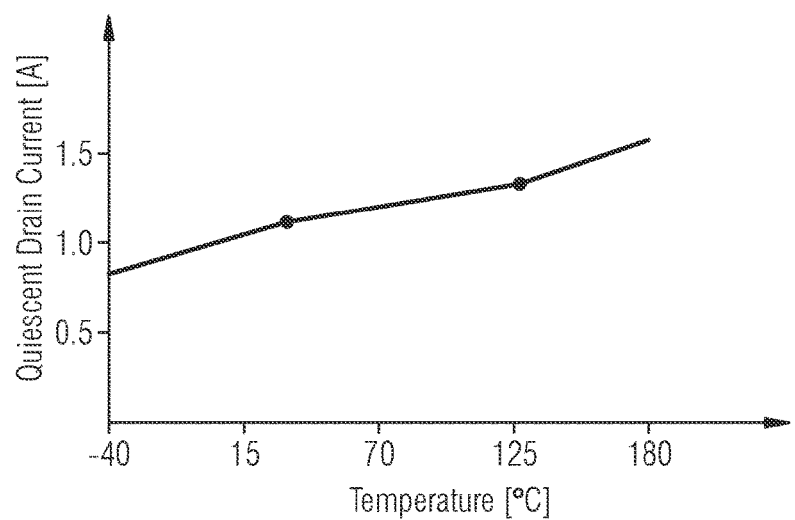
FIG. 3 illustrates quiescent drain current as a function of temperature for a transistor with a constant gate bias voltage.

FIG. 3 illustrates quiescent drain current as a function of temperature for a transistor, such as the transistor $Q_1$ of FIG. 1, when a constant bias voltage is applied to its gate. In other words, no temperature or other compensation is applied to the bias voltage. As shown in FIG. 3, the quiescent drain current has a strong linear dependence on temperature. For such a case, second and higher order terms may largely be ignored and a linear mapping from temperature to gate bias offset could be used. For a less linear relationship between temperature and quiescent drain current, a linear mapping may be inadequate. Several techniques for generating a gate bias offset ($V_{OFFSET}$) are described below. While the techniques vary according to the mapping technique involved, they are similar in that they generate a gate bias offset ($V_{OFFSET}$) based upon an input temperature.

Figure 4:
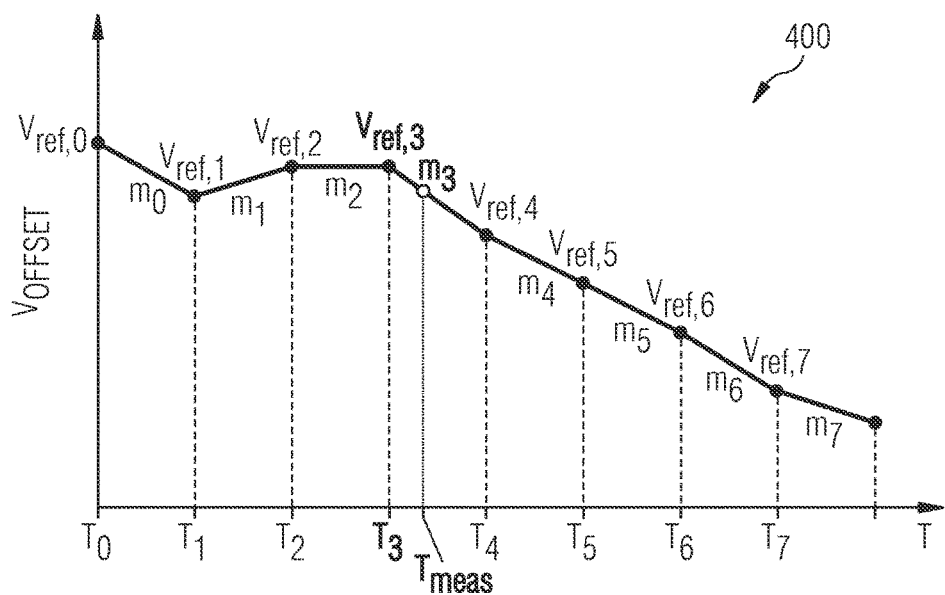
FIG. 4 illustrates a mapping from temperature to transistor gate bias offset, wherein the mapping is based upon piecewise linear interpolation.

In a first sub-embodiment, the temperature is provided to an $n^{th}$ order polynomial which outputs the gate bias offset ($V_{OFFSET}$). (The corner case wherein the degree n=1 represents the linear mapping described previously.) An RF PA is characterized, e.g., during a calibration step, to determine the polynomial coefficients. Consider a sequence of reference gate bias offset values $V_{ref,i}$ corresponding to temperatures $T_i$, wherein each gate bias offset value $V_{ref,i}$ produces the desired quiescent drain current at the associated temperature $T_i$. Such data points are illustrated in FIG. 4. A Lagrange interpolation polynomial (not illustrated) may be fitted to the data points given by ($V_{ref,i}, T_i$) during an initial characterization of an RF PA. (Because polynomial curve-fitting techniques are known in the art, the specific details regarding generation of the polynomial coefficients are not described herein.) Subsequently, during normal operation of the temperature compensator 120, gate bias offset values $V_{OFFSET}$ may be produced based upon the sensed temperature (T) and the interpolation polynomial.

In a second sub-embodiment, the mapping from temperature (T) to gate bias offset ($V_{OFFSET}$) is provided via look-up table (LUT). The temperature T is used as an address to a LUT that contains gate bias offset ($V_{OFFSET}$) values corresponding to each potential temperature value. This second sub-embodiment requires less computational complexity than the first sub-embodiment, but at the expense of higher memory requirements for storing the LUT. The second sub-embodiment may be preferred in applications that have limited processing capability.

In a third sub-embodiment, the mapping from temperature (T) to gate bias offset ($V_{OFFSET}$) is based upon LUTs and piecewise-linear interpolation. Such a mapping 400 is illustrated in FIG. 4. A temperature compensator, such as the temperature compensator 120 illustrated in FIG. 1, may use the measured temperature T and the mapping 400 to determine the offset bias voltage. For example, if the measured temperature T=$T_2$, then the gate bias offset would be set to $V_{OFFSET}=V_{ref,2}$. If the measured temperature T is an intermediate value that falls between two reference temperatures $T_i$ and $T_{i+1}$, then the gate bias offset is determined from a straight line interpolation connecting the two closest reference data points $V_{ref,i}$ and $V_{ref,i+1}$. Taking the example of a measured temperature T=$T_{meas}$ as illustrated in FIG. 4, the resultant gate bias offset would be set to:

$$V_{OFFSET}=V_{ref,3}+m_3(T_{meas}-T_3) \quad (1)$$

The construction of a mapping from temperature (T) to gate bias offset ($V_{OFFSET}$) requires that an RF PA, or transistor(s) therein, be characterized for multiple temperatures. For the mapping 400 illustrated in FIG. 4, such a characterization would be carried out for K=8 temperatures, which are preferably equally spaced across the operating temperature range of the RF PA. For each temperature $T_i$, a reference gate voltage $V_{ref,i}$ is determined that provides the desired quiescent current through the RF PA. The resultant reference voltages $V_{ref,i}$ are then stored, e.g., in a table within a memory of the adaptive bias controller 110. In a preferred embodiment based upon piecewise-linear interpolation, gradients $m_i$ corresponding to the slopes of the segments connecting the reference voltages $V_{ref,i}$ are also stored.

The characterization of an RF PA over multiple temperatures represents a significant calibration step that would preferably be avoided in the production of individual RF PAs (or their transistors). While the gate-voltage-to-quiescent-current mapping generally varies from device to device, even within the same wafer, the gradients, e.g., $m_i$, of the mappings for different devices is often fairly consistent across devices. For example, the mapping 400 illustrated in FIG. 4 may characterize a particular MOSFET. Other MOSFETs from the same wafer or manufacturing batch will typically have a mapping that has the same shape (gradients), but whose mappings are offset by a constant value such that their mappings are higher or lower than that of the particular MOSFET. Such offsets for individual transistors are due to variations in the pinch-off voltage across a wafer, but this has little effect on the slope of the mapping due to temperature. This property may be used to advantage in the characterization of RF PAs, thereby avoiding a lengthy calibration for each transistor used in RF PAs.

In a preferred construction of the temperature mappings for a group of RF PAs, a characteristic RF PA, or a transistor therein, is chosen to represent a batch of RF PAs. The batch may comprise all of the transistors within a wafer, all of the transistors within a manufacturing lot, or a similar group of transistors. The temperature (T) to gate bias offset ($V_{OFFSET}$) mapping is determined as described above for the characteristic transistor. A second transistor from the batch is then characterized, but not throughout the temperature range. In a preferred sub-embodiment, a reference voltage $V_{ref}$ is determined at one temperature for the second transistor. This is compared against the reference voltage for the characteristic transistor at that same temperature. The difference represents a constant offset for the second transistor. The temperature (T) to gate bias offset ($V_{OFFSET}$) mapping for the second transistor may then be determined by summing the constant offset of the second transistor with the temperature mapping of the characteristic transistor. This technique is then repeated for the remaining transistors within the batch. Such a technique yields a fairly accurate mapping for each transistor, while avoiding a time-consuming and expensive process of comprehensively characterizing, via empirical calibration and measurement, each transistor across multiple temperatures.

With a temperature (T) to gate bias offset ($V_{OFFSET}$) mapping determined, e.g., using one of the three sub-embodiments described above, an open-loop temperature compensator may be implemented in a variety of ways ranging from software within an embedded processor to a dedicated hardware implementation.

Figure 5:
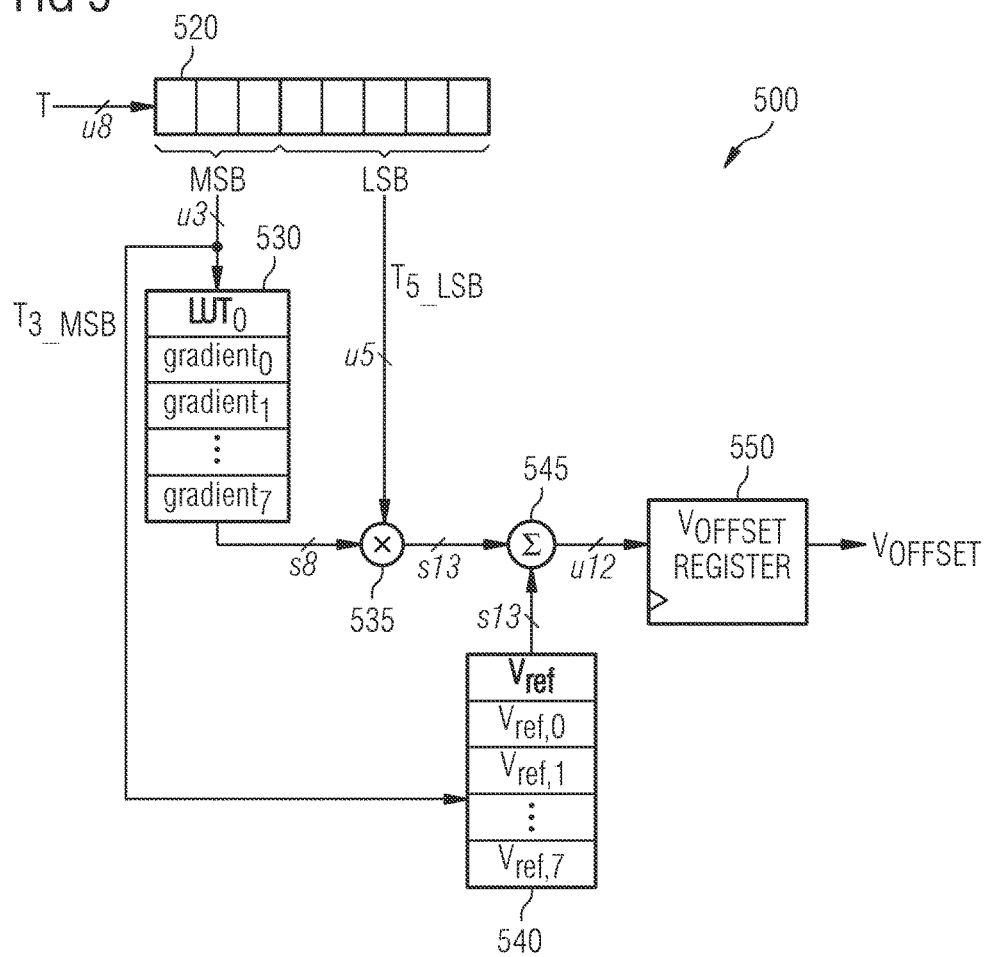
FIG. 5 illustrates an embodiment of a temperature compensator, as may be included in the adaptive bias controller of FIG. 1.

FIG. 5 illustrates an embodiment of a temperature compensator 500, as may be included in the adaptive bias controller 100 of FIG. 1, and which is based upon LUTs and piecewise-linear interpolation. This embodiment provides adequate accuracy and requires minimal hardware resources. A temperature sensor (not shown for ease of illustration) measures a temperature which is digitized by an analog-to-digital converter (ADC). An 8-bit temperature T generated by the ADC is provided to a register 520. For the purpose of explanation, let us assume that the usable range of the temperature sensor is −40° C. to 180° C. The 8-bit ADC provides 256 discrete values wherein 0 corresponds to −40° C. and 255 corresponds to 180° C., thereby covering a range of 220° C. Hence, each discrete step of the 8-bit ADC output represents:

$$\frac{220° \text{ C.}}{256 \text{ steps}} = \frac{0.86° \text{ C.}}{\text{step}}.$$

Presume that a temperature to reference bias voltage mapping, as shown in FIG. 4, includes K=8 discrete reference points, such that the temperature difference between reference points is given by a temperature segment subrange of:

$$\frac{220° \text{ C.}}{8 \text{ segments}} = 27.5° \text{ C./segment.}$$

segment. Table 1 below shows the temperature ranges in Celsius that correspond to the unsigned ADC output values for the 8-bit temperature T.

TABLE 1

| Digitized representation of temperature | |
|---|---|
| Temperature Range (° C.) | T (ADC output) |
| −40 to −12.5 | 0-31 |
| −12.5 to 15 | 32-63 |
| 15 to 42.5 | 64-95 |
| 42.5 to 70 | 96-127 |
| 70 to 97.5 | 128-159 |
| 97.5 to 125 | 160-191 |
| 125 to 152.5 | 192-223 |
| 152.5 to 180 | 224-255 |

For K=8=$2^3$ segments, the 3 most-significant bits (MSBs) from the sensed temperature T are used as an address for one or more look up tables (LUTs). The LUTs are typically stored in read-only memory (ROM). The temperature compensator 500 includes an $LUT_0$ 530 that includes gradients (slopes) for each of K=8 temperature segments. These gradients correspond to the slopes $m_0 \ldots m_7$ illustrated in the mapping 400 of FIG. 4. A second LUT 540 includes the K=8 gate reference offset values ($V_{ref,i}$). The second LUT 540 may be populated during a characterization (calibration) phase of the adaptive bias controller 110, or may be dynamically populated during a power-up phase. (The gate reference offset values could even be dynamically calculated as needed thereby obviating the need for a second LUT; such an implementation is not preferred to its added computational requirements.) Provided that the gradients are known, the values $V_{ref,i}$ of the second LUT 540 may be generated using the following pseudocode.

$V_{ref,0} := V_{nominal}$
For $i := 1$ to $k - 1$ do
$V_{ref,i} := V_{ref,i-1} + m_{i-1} *$ (Segment Size)

The nominal gate voltage $V_{nominal}$ may be determined by a closed-loop controller during a characterization (calibration) phase or as part of a power-up sequence. More particularly, the value $V_{nominal}$ may be determined by adding a reference voltage $V_{ref,0}$ corresponding to the characteristic transistor to a device-specific offset determined for the device of interest.

With the LUTs 530, 540 populated, a linear interpolation is used to determine the temperature-compensated bias voltage, e.g., $V_{OFFSET}$ in FIG. 1. The temperature T is partitioned into a high portion $T_{3\_MSB}$ representing its 3 MSBs, and a low portion $T_{5\_LSB}$ representing its 5 LSBs. The high portion $i=T_{3\_MSB}$ is used as an address to the gradient $LUT_0$ 530, so as to extract an appropriate slope (gradient$_i$) from this LUT. The high-portion $T_{3\_MSB}$ is additionally used as an address to the second LUT 540, so as to extract a gate reference offset value $V_{ref,i}$ corresponding to the temperature T. A multiplier 535 multiplies the low portion $T_{5\_LSB}$ of the temperature with the appropriate gradient, and the product is input to an adder 545. The adder 545 sums this product with the extracted gate reference offset value $V_{ref,i}$ and provides the result to a $V_{OFFSET}$ register 550. The $V_{OFFSET}$ register 550 latches the result, e.g., using a clock input (not shown). Typically, the $V_{OFFSET}$ register 550 will be latched each time a new temperature value T is available from the ADC. Note that the temperature compensator 500 represents a hardware implementation sub-embodiment of the equation (1).

Closed-Loop Controller

As described above, the closed-loop controller 160 of FIG. 1 is preferably a PID controller. However, it should be recognized that other types of controllers are possible, and may be preferred in some applications. For example, the derivative part of PID controller may be omitted, thereby resulting in a PI controller. A PID controller is preferred, as it provides good performance for many different applications and across a wide range of conditions. A proportional control portion, as determined from the coefficient $K_p$, reduces the rise time and, without more, will reduce but never eliminate the steady-state error. An integral control portion, having a control coefficient $K_i$, reduces the steady-state error for a constant or step input, but at the expense of a slower transient response. A derivative control portion, having a coefficient $K_d$, will have the effect of increasing the stability of the system, reducing the overshoot, and improving transient response.

A discrete-time PID controller can, in general, be implemented using the following difference equation:

$$u[k]=u[k-1]+K_1 e[k]+K_2 e[k-1]+K_3 e[k-2] \quad (2)$$

Figure 6:
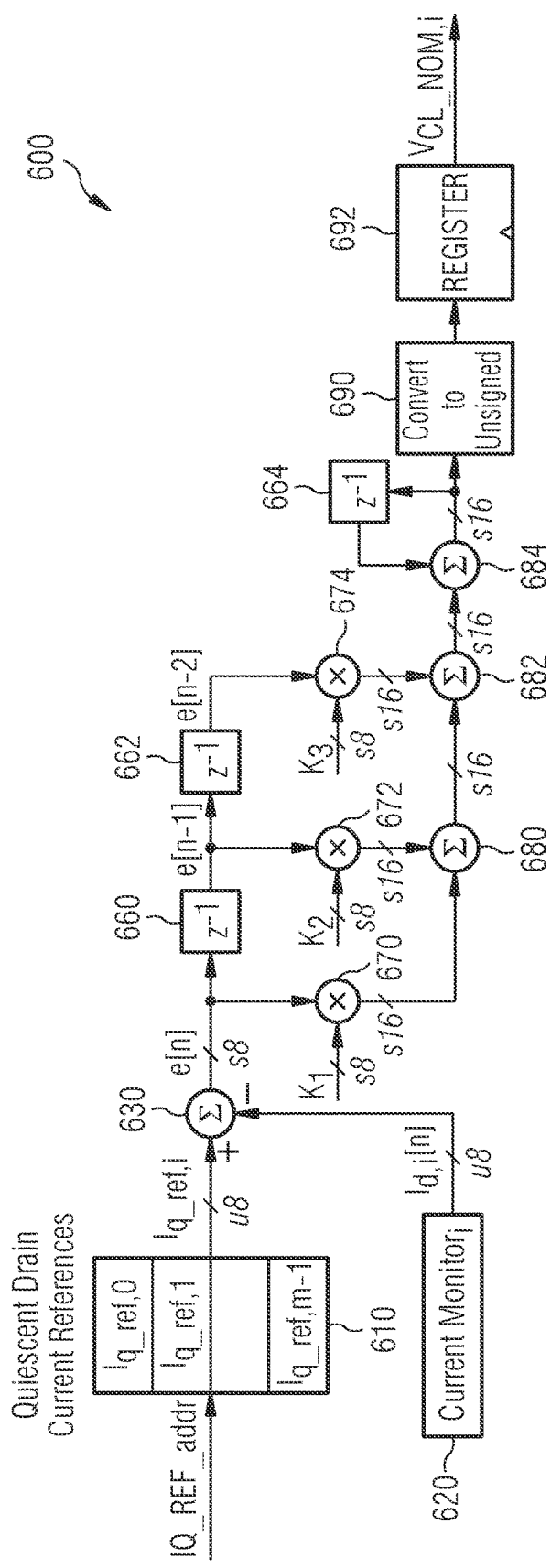
FIG. 6 illustrates an embodiment of a closed-loop controller, as may be included in the adaptive bias controller of FIG. 1.

FIG. 6 illustrates a closed loop controller 600 that implements the above difference equation. A summing circuit 630 is used to compare a desired reference current $I_{q\_ref,i}$ and a sensed current sample $I_{d,i}[n]$ for a given transistor i of an RF PA or a group of RF PAs, so as to generate the error (difference) signal e[n]. The error signal e[n] computed from the desired current and the sensed current sample is provided to a delay chain comprised of a first sample delay 660 and a second sample delay 662. The error signal e[n] and its discrete-time delayed versions e[n−1], e[n−2] are provided to first, second, and third multipliers 670, 672, 674, which multiply these error signals by first, second, and third coefficients $K_1$, $K_2$, $K_3$. The resultant products are summed using second and third adders 680, 682 to produce a control signal update at the output of the second adder 682. A sample delay 664 and a fourth adder 684 are used to generate a control signal output u[n] that is based upon the current control signal update and a prior sample u[n−1] of the control signal output. A conversion circuit 690 converts this result into an unsigned value appropriate for input to a DAC. Each updated version of this unsigned value is latched into a register 692, as long as the closed-loop controller 600 is active, e.g., its components are being clocked. Once the closed-loop controller 600 is disabled, e.g., due to the $EN_{CL}$ signal shown in FIG. 1 being disabled, the register 692 maintains a nominal bias control voltage $V_{CL\_NOM,i}$ for the transistor i. As shown in FIG. 1, a nominal bias control voltage such as this is summed with the output of the temperature compensator to provide a bias control voltage for a transistor. In a preferred embodiment, the nominal bias voltage $V_{CL\_NOM}$ and the temperature compensator output $V_{OFFSET}$ are digitally added and the sum is provided to a DAC which provides the analog bias control voltage $V_{BIAS}$, as shown in FIG. 1. (For ease of illustration, such a DAC is not illustrated in FIG. 1. The adder 190 in FIG. 1 may be a digital adder.) In another embodiment (not illustrated), a DAC may be included in each of the closed-loop controller and the temperature compensator, and the adder 190 of FIG. 1 may be an analog adder.

As illustrated in FIG. 6, there is an array of quiescent drain current reference values 610 and an array of current monitors 620. The multiple values correspond to different transistors within an RF PA or spread across multiple RF PAs. In this way, the closed-loop controller 600 may support a plurality of transistors and/or RF PAs. When working on a particular transistor i, an IQ_REF_addr corresponding to i is used to extract the appropriate quiescent drain current reference. (In some implementations, the same reference may be used for multiple transistors.) The current monitor 620 includes a multiplexor (not shown) so that the transistor i of interest may be routed to the summing circuit 630. The converted output of the control loop 690 will then be written into the appropriate register 692 for the transistor i. (While not illustrated, there will typically be m registers 692, each of which corresponds to one of the m transistors.) In this way, the closed-loop controller 600 may be time-spliced such that it can support multiple transistors, thereby minimizing the hardware required for closed-loop control. (In some applications wherein the RF PAs are spread out over multiple physical locations, such re-use may not be feasible, in which case separate closed-loop controllers 600 may be required for each RF PA.)

Adaptive Bias Controller for Multiple RF PAs

Figure 7:
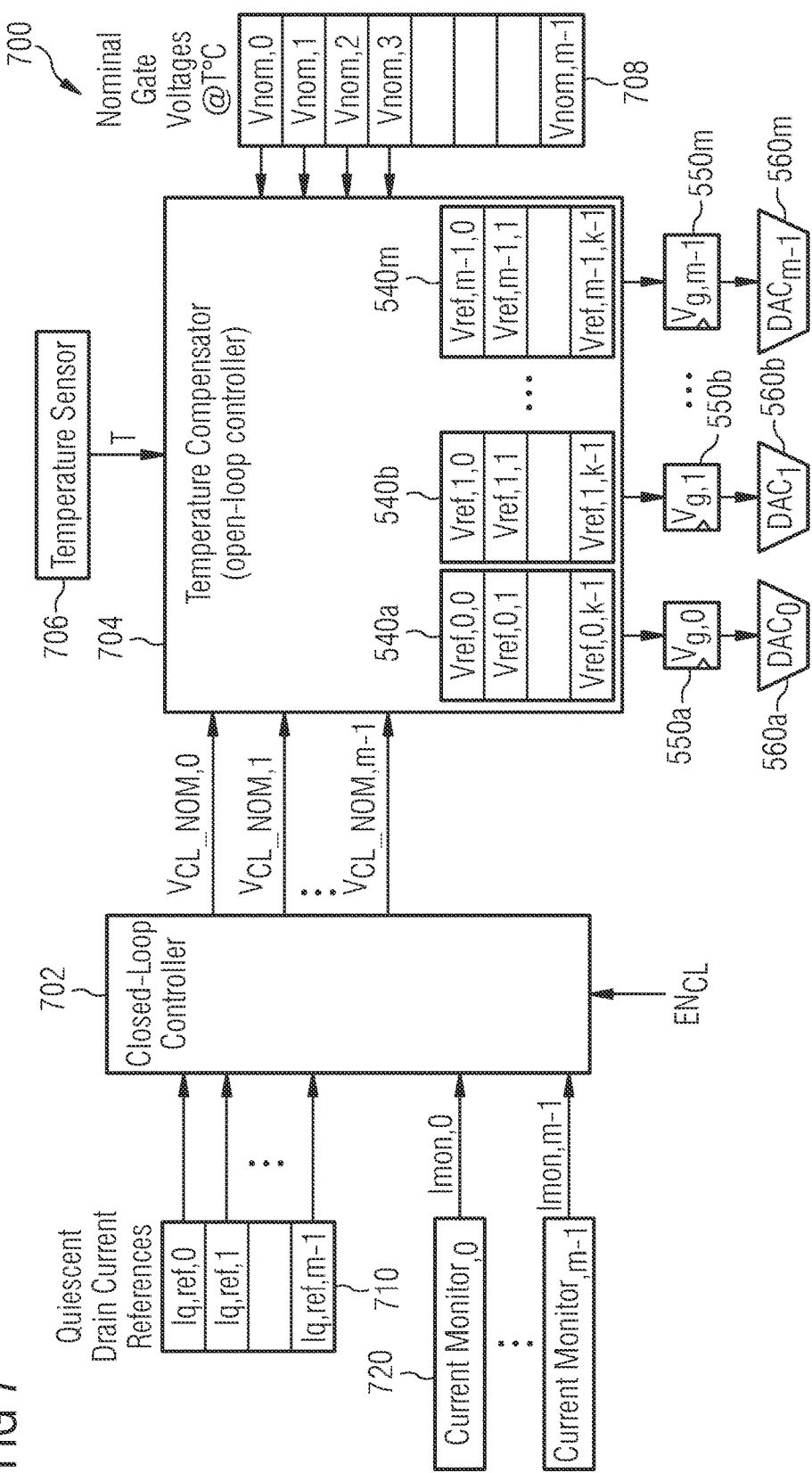
FIG. 7 illustrates an adaptive bias controller configured to bias a plurality of RF PAs.

The closed-loop controller 600 of FIG. 6 is described as being configured to support multiple transistors and/or RF PAs. FIG. 7 illustrates an embodiment of an adaptive bias controller 700 that is configured to support multiple transistors.

The closed loop controller 702, the quiescent drain current references 710, and the current monitors 720 are similar to those described regarding the closed loop controller of FIG. 6. As shown, m transistors are supported by the closed loop controller 702, which outputs nominal bias control values $V_{CL\_NOM}$ for each of the m transistors.

The temperature compensator 704 of FIG. 7 represents an extension of the temperature compensator 500 of FIG. 5. The temperature compensator 704 includes LUTs 540a, 540b . . . 540m corresponding to each of m transistors for which a bias is generated. LUTs corresponding to the gradient $LUT_0$ 530 of FIG. 5 would also be included in the temperature compensator 704, but are not shown for ease of illustration. The registers 550a, 550b . . . 550m and the DACs 560a, 560b, . . . 560m are as described regarding FIG. 5. Alternatively, a temperature compensator using a single LUT without the piecewise interpolation of the temperature compensator 500 could be used, or a temperature compensator based upon a polynomial function could be used.

As illustrated in FIG. 7, the temperature sensor 706 is used to determine the temperature compensation for each of the m transistors. In an alternative embodiment (not illustrated), multiple temperature sensors may be used. This may be preferred particularly in applications wherein the RF PAs supported by the adaptive bias controller 700 are physically separated and the temperatures of the associated transistors differ significantly. For such applications, it may be preferable to include a temperature sensor near each of the m transistors, so that the temperature of each transistor may be closely tracked.

A table 708 of the nominal gate voltages Vnom is stored within the adaptive bias controller 700. Each of these nominal gate voltages corresponds to one of the m transistors, and is used to generate the LUTs 540a, 540b, . . . 540m within the temperature compensator 704. For example, the nominal gate voltages Vnom may represent the constant offsets for each transistor which, when combined with the representative temperature gradients, generate the LUTs. (Further detail of the nominal gate voltages is provided in conjunction with the description of FIG. 5.)

Method for Adaptively Biasing an RF PA

Figure 8:
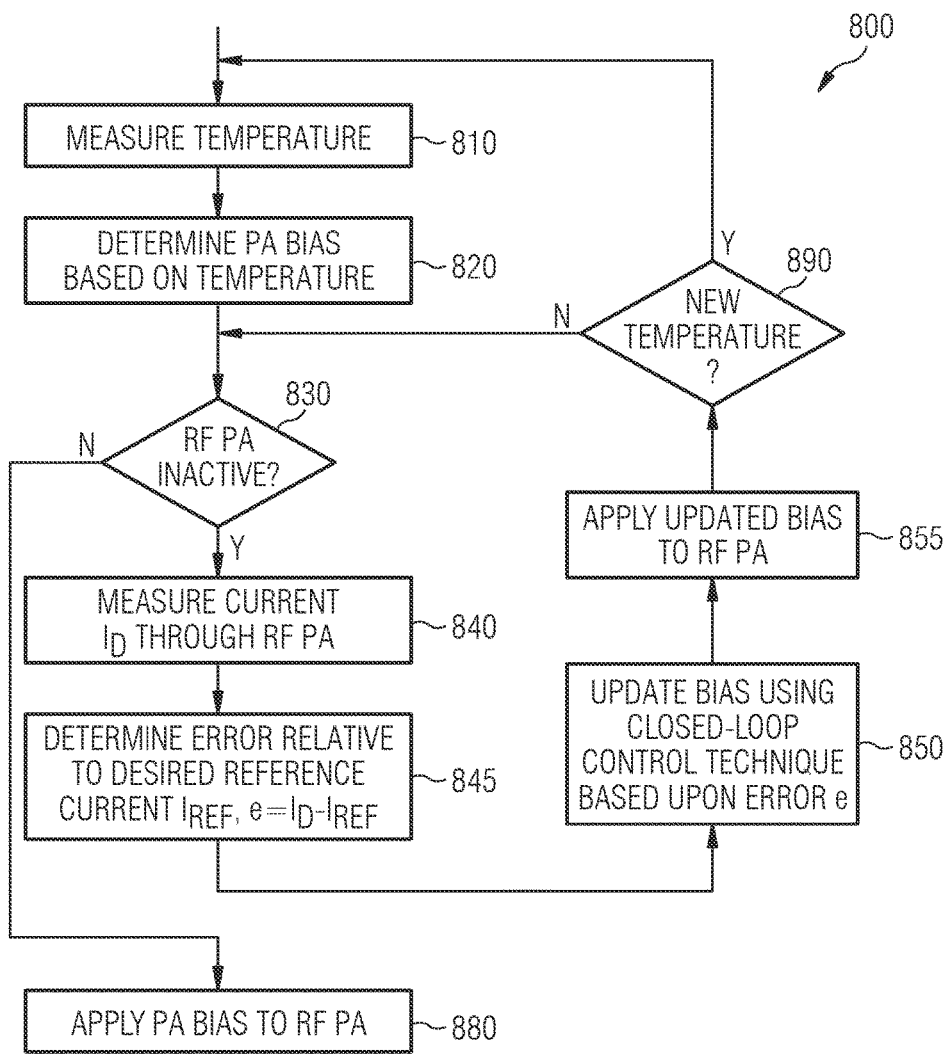
FIG. 8 illustrates a method for biasing an RF PA.

FIG. 8 illustrates a method 800 for adaptively biasing an RF PA. Such a method may be implemented in an adaptive bias controller such as that illustrated in FIG. 1 and its subembodiments, as described above. For ease of explanation, the example method 800 of FIG. 8 is only described for controlling the bias for one RF PA, but the method is readily extrapolated to control multiple RF PAs using the same techniques described above regarding FIG. 7.

The method 800 begins by measuring 810 a temperature, e.g., using a thermistor and an ADC, and using the measured temperature to determine 820 a PA bias. If the RF PA is detected 830 to be active, then the determined bias is applied 880 to the RF PA immediately. Otherwise, i.e., if the RF PA is inactive, closed-loop techniques are used to update the RF PA bias.

The closed-loop techniques begin by measuring 840 (sampling) a current $I_D$ through the RF PA. An error is determined 845 based upon a target reference current $I_{REF}$ and the measured current sample $I_D$. The error is used to update 850 the PA bias using a closed-loop technique, e.g., PID control. The updated PA bias is then applied 855 to a control terminal of the RF PA, which has the effect of altering the quiescent current flowing through the RF PA. If no new temperature measurement is available 890, the closed-loop steps 840, 845, 850, 855 are repeated until the RF PA is no longer inactive 830. If a new temperature measurement is available, the steps of measuring 810 the temperature and determining 820 a PA bias based upon that temperature are performed before checking 830 for RF PA activity and continuing with the closed-loop control. While the RF PA is active, the PA bias is determined 820 and applied repeatedly 880 each time a new temperature measurement is available.

FIG. 9 illustrates an alternative method 900, which includes additional optional steps beyond those illustrated in FIG. 8. More particularly, the method 900 allows the closed-loop control to exit if it is determined that it has converged within an acceptable error tolerance. Only those steps that differ from those of FIG. 8 are described below.

After the error has been determined 845, a check 960 is made to determine if the absolute value of the error is below an acceptable error limit $e_{LIMIT}$. If not, then the closed loop PA bias updating 850 continues and the updated PA bias is applied 855 to the RF PA. If the absolute value of the error falls below the acceptable error limit $e_{LIMIT}$, then the closed-loop control may abort by passing control to the step 880.

In some other steps 965, 970, 975, shown in dotted boxes to indicate that they are optional within the method 900, a convergence timer may be used to ensure that the absolute value of the error stays below the error limit $e_{LIMIT}$ for a predetermined convergence time $T_{CONVERGE}$. Whenever the error is determined 960 to be above the acceptable error limit $e_{LIMIT}$, the convergence timer is reset. If the error is below 960 the acceptable error limit $e_{LIMIT}$, a convergence timer is incremented 970 and the control loop continues as long as the convergence timer has not reached 975 its convergence limit $T_{CONVERGE}$. Once the convergence timer indicates that the error has remained below the error limit $e_{LIMIT}$ for at least the convergence time $T_{CONVERGE}$, the closed-loop control is aborted.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for adaptively biasing a Radio Frequency (RF) Power Amplifier (PA), the method comprising:
   measuring a temperature for the RF PA;
   determining a PA bias based upon the measured temperature;

detecting that the RF PA is in an inactive mode wherein no RF input is provided but a quiescent current is flowing through the RF PA;
responsive to detecting that the RF PA is in the inactive mode:
measuring the quiescent current,
comparing the measured quiescent current to a reference current to generate an error current,
using a closed-loop control technique and the error current to generate a correction bias term; and
updating the PA bias based upon the correction bias term; and
applying the PA bias to a control terminal of the RF PA.

2. The method of claim 1, wherein the steps of measuring the temperature, determining the PA bias, and applying the PA bias are performed when the RF PA is in an active mode and when the RF PA is in the inactive mode, and are repeated whenever a new temperature measurement is available for the RF PA.

3. The method of claim 1, wherein the closed-loop control technique is performed by a proportional integral derivative (PID) controller.

4. The method of claim 1, wherein determining the PA bias is based upon a look-up table that includes mappings from temperature values to PA bias values.

5. The method of claim 1, wherein determining the PA bias is based upon a polynomial operation that generates the PA bias from the measured temperature.

6. The method of claim 1, wherein determining the PA bias is based upon a piecewise-linear mapping of temperature to PA bias.

7. The method of claim 1, wherein determining the PA bias is based upon a mapping of temperature to PA bias, wherein the mapping is generated prior to normal operation of the RF PA, and the mapping is generated by:
determining a characteristic mapping for a characteristic RF PA that is different from the RF PA, the characteristic mapping covering a plurality of temperatures across an operational temperature range for the characteristic RF PA; and
basing the mapping for the RF PA on the characteristic mapping.

8. The method of claim 7, wherein the mapping generation further comprises:
placing the RF PA in the inactive mode;
measuring a calibration temperature for the RF PA;
determining a calibration PA bias based upon the calibration temperature and applying the calibration PA bias to a control terminal of the RF PA;
measuring a calibration quiescent current;
comparing the calibration quiescent current to the reference current to generate a calibration error current;
using a closed-loop control technique and the calibration error current to generate a calibration correction term; and
generating a mapping for the RF PA based upon the characteristic mapping and the calibration correction term.

9. The method of claim 1, wherein the RF PA comprises a laterally diffused metal-oxide semiconductor (LDMOS) field effect transistor or a gallium nitride (GaN) based transistor, wherein the control terminal of the RF PA is a gate terminal of the LDMOS or the GaN based transistor, and the RF PA bias is a voltage applied to the gate terminal.

10. The method of claim 1, wherein detecting that the RF PA is in the inactive mode is performed by receiving a closed-loop control enable signal.

11. A bias controller for a Radio Frequency (RF) Power Amplifier (PA), comprising:
a temperature compensation circuit configured to:
measure a temperature for the RF PA; and
determine a PA bias based upon the measured temperature, and
a closed-loop controller configured to:
detect that the RF PA is in an inactive mode wherein no RF input is provided but a quiescent current is flowing through the RF PA;
responsive to the detection that the RF PA is in the inactive mode:
measure the quiescent current,
compare the measured quiescent current to a reference current to generate an error current,
generate a correction bias term based upon the error current, and
update the PA bias based upon the correction bias term; and
a control terminal driver configured to apply the PA bias to a control terminal of the RF PA.

12. The bias controller of claim 11, wherein the closed-loop controller is a proportional integral derivative (PID) controller.

13. The bias controller of claim 11, further comprising:
a look-up table comprising mappings from temperature values to PA bias values.

14. The bias controller of claim 11, wherein the temperature compensation circuit is further configured to determine the PA bias based upon a polynomial operation that generates the PA bias from the measured temperature.

15. The bias controller of claim 11, wherein determination of the PA bias is based upon a piecewise-linear mapping of temperature to PA bias.

16. The bias controller of claim 11, wherein the temperature compensation circuit is further configured to determinate the PA bias based upon a mapping of temperature to PA bias, wherein the mapping is generated prior to normal operation of the RF PA, and the mapping is generated by:
determining a characteristic mapping for a characteristic RF PA that is different from the RF PA, the characteristic mapping covering a plurality of temperatures across an operational temperature range for the characteristic RF PA; and
basing the mapping for the RF PA on the characteristic mapping.

17. The bias controller of claim 16, wherein the mapping generation is further performed by:
placing the RF PA in the inactive mode;
measuring a calibration temperature for the RF PA;
determining a calibration PA bias based upon the calibration temperature and applying the calibration PA bias to a control terminal of the RF PA;
measuring a calibration quiescent current;
comparing the calibration quiescent current to the reference current to generate a calibration error current;
using a closed-loop control technique and the calibration error current to generate a calibration correction term; and
generating a mapping for the RF PA based upon the characteristic mapping and the calibration correction term.

18. The bias controller of claim 1, wherein the RF PA comprises a laterally diffused metal-oxide semiconductor (LDMOS) field effect transistor or a gallium nitride (GaN) based transistor, the control terminal of the RF PA is a gate terminal of the LDMOS or the GaN based transistor, and the RF PA bias is a voltage applied to the gate terminal.

19. The bias controller of claim 1, wherein the detection that the RF PA is in an inactive mode is performed by receiving an enable signal for the closed-loop controller.

* * * * *